United States Patent [19]

Fuhrman

[11] Patent Number: 4,581,106

[45] Date of Patent: Apr. 8, 1986

[54] MODIFIED METHOD OF MAKING A STENCIL PLATE

[75] Inventor: Chester D. Fuhrman, Columbia, Pa.

[73] Assignee: Armstrong World Industries, Inc., Lancaster, Pa.

[21] Appl. No.: 751,722

[22] Filed: Jul. 3, 1985

[51] Int. Cl.⁴ .............................................. C25D 1/08
[52] U.S. Cl. ...................................................... 204/11
[58] Field of Search .......................................... 204/11

[56] References Cited

U.S. PATENT DOCUMENTS 3,437,578  4/1969  Gibbs .................................. 204/231
4,490,217  12/1984  Culp ...................................... 204/11

Primary Examiner—T. M. Tufariello

[57] ABSTRACT

A stencil plate is made by an electroplating process rather than a steel fabricated process. A resist material and a film are placed upon a matrix and by using conventional photoresist operations, a resist coating is formed on the matrix in the shape of the apertures to be formed in the stencil plate. Metal is electroplated on the upper surface of the matrix and around the shaped resist material forming a stencil plate.

In some areas, a narrow strip of material must be deposited and overplating occurs. Supplemental open areas adjacent the narrow strips to be plated form removable slugs of plating material which help eliminate the overplating in the narrow strip areas.

1 Claim, 4 Drawing Figures

MODIFIED METHOD OF MAKING A STENCIL PLATE

BACKGROUND OF THE INVENTION

1. Field of the Invention

The invention is directed to a method of making a stencil plate and, more particularly, to the forming of a stencil plate by an electroplating operation.

2. Description of the Prior Art

A technique for forming a stencil plate by an electroplating process is disclosed in U.S. Pat. No. 4,490,217 and the disclosure of this patent is incorporated herein by reference.

U.S. Pat. No. 3,437,578 discloses a robber control of electroplating. The robber elements 17 deprive the cathode of some of the material being deposited and causes the material to be deposited upon the robber instead of the cathode.

SUMMARY OF THE INVENTION

There is disclosed a method of forming a flat stencil plate. The first step involves the placing of a photoresist coating on the surface of the matrix. A film artwork is placed over the surface of the resist coating and the film is exposed to sensitize the resist coating in selected regions beneath the film artwork. The exposed resist coating is developed and this produces a pattern of resist material with large open areas of no resist material on the matrix and small islands of resist material on the matrix. The small islands of resist have narrow strips of open area extending completely through each island of resist material subdividing each island into a plurality of segments. The surface of the matrix is then plated to deposit a material in the large open areas and around the resist materials and in the narrow strips of open area. This then forms a plate structure with apertures therein and this deposit of material is removed from the matrix to form the stencil plate.

The invention herein is an improvement over that of U.S. Pat. No. 4,490,217 which discloses providing open areas in each segment of resist surrounding the narrow strips of open area. The open areas provided herein in each segment are unconnected to the large open areas. The plating of the surface of the matrix and the depositing of the material in the newly provided open area of said segments will lessen the normal deposition of material to the narrow strips of open area. Because the open areas adjacent the narrow strips are unconnected to other open areas, removable pieces of plated material are formed which do not become part of the stencil plate formed by electroplating.

The presence of the open areas near the narrow strips of the open area control the amount of deposition of material in the narrow strips of open area and prevent an overplating of material in those areas.

DESCRIPTION OF THE PREFERRED EMBODIMENT

Figure 1:
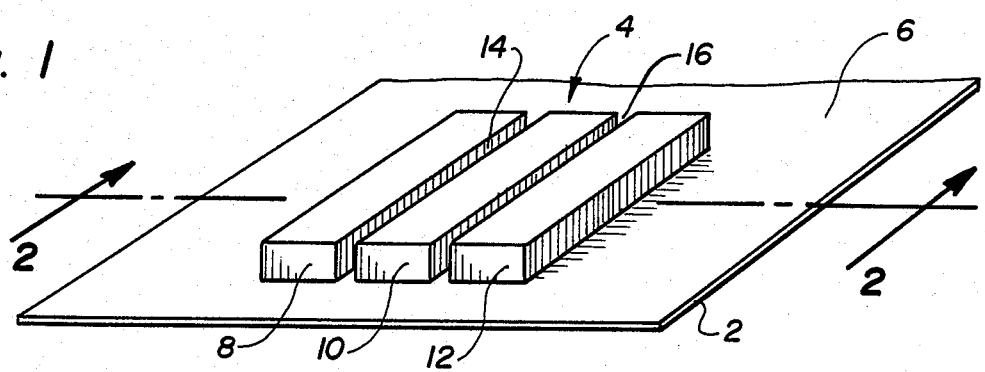
FIG. 1 is a perspective view of resist pattern on the matrix.

The invention herein is carried out utilizing the method of U.S. Pat. No. 4,490,217. FIG. 1 shows the resist pattern which may exist in part on a matrix. The matrix 2 is provided with a resist coating formed in a particular pattern. There are formed large open areas 6 and other areas covered by the resist pattern 4. The resist pattern 4 is divided into three segments 8, 10 and 12 by narrow strips of open areas 14 and 16.

Figure 2:
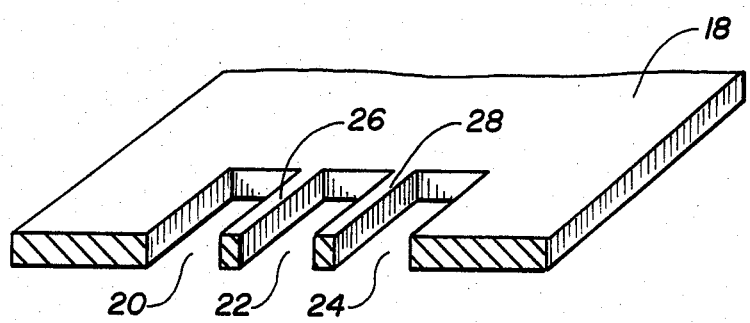
FIG. 2 is a perspective view of a portion of the stencil plate formed from the resist pattern of FIG. 1.

In FIG. 2, the stencil plate formed by electroplating the structure of FIG. 1 is shown as a perspective view, partially in cross-section along line 2—2 of FIG. 1. The open area 6 has been covered with a plating material to form the large area 18 of plated material. Where the resist elements 8, 10 and 12 existed, there are open areas 20, 22 and 24. Where the narrow strips of open areas 14 and 16 existed, there are now narrow strips of deposited material 26 and 28. Elements 26 and 28 are joined to the large area 18 because the narrow strips of open area in the FIG. 1 construction join up with the large open area 6.

Figure 3:
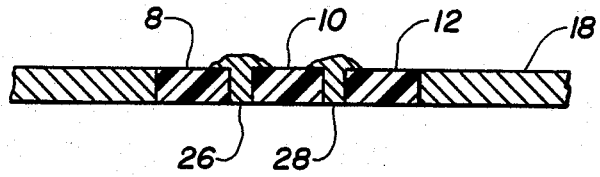
FIG. 3 is a cross-sectional view of a resist covered matrix after plating using the prior art process for plating.

FIG. 3 shows the structure of FIG. 1 in cross-section with the plating material deposited thereon and the resists still in place on the matrix. The large open areas 18 are present along with the narrow strips 26 and 28. The resist material 8, 10 and 12 are also present. It should be noted that there are mounds of deposited material positioned on top of elements 26 and 28. The narrow strips of open area tend to receive deposited material at a much greater rate than the open area 6. Therefore, material is deposited in the open areas 14 and 16 in FIG. 1 at a much higher rate than the open area 6. This results in an overplating of the areas 14 and 16 and a build up of material in those areas higher than the material deposited in the open area 6. This excess material must be removed in order to form the finished plate shown in FIG. 2. This requires a partial hand fabrication of the plate or in effect, a correction of an undesirable result of the plating operation.

Figure 4:
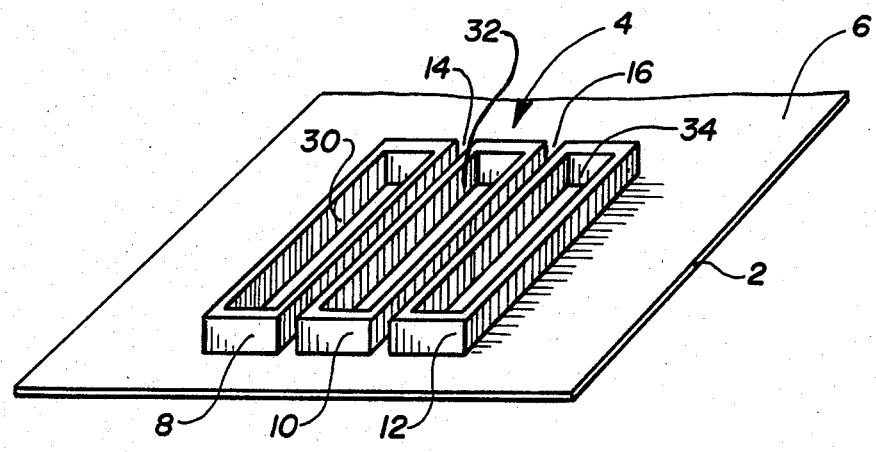
FIG. 4 is a perspective view of the resist pattern on the matrix involving the invention herein.

The overplating in the areas of elements 26 and 28 are overcome by the use of the resist coating pattern shown in FIG. 4. Here the matrix 2 is provided with open area 6 and a pattern of resist material 4. The overall outline of the resist material 4 is the same as that in FIG. 1 and there are provided the narrow strips 14 and 16 of open area, which extend completely through the island 4 of resist material subdividing the island into a plurality of segments 8, 10 and 12. The difference between the structure of FIG. 1 and FIG. 4 is that each of the segments 8, 10 and 12 have open areas 30, 32 and 34 therein. Consequently, there is provided areas adjacent the narrow strips 14 and 16 that can receive plating material. It is noted that the narrow strips of open areas 14 and 16 are connected to the open area 6 whereas open areas 30, 32 and 34 are not connected to any other open area.

Plating is carried out in the same manner disclosed in U.S. Pat. No. 4,490,217 and the structure resulting is the same as that shown in FIG. 3 except that the raised mounds of overplated material above elements 26 and 28 are not present and material is now deposited in areas 30, 32 and 34. Consequently, these areas 30, 32 and 34 in effect absorb part or all of the excess plating material which would normally be deposited in the narrow strips of open areas 14 and 16. When the resist material and the plated material are removed from the matrix, the pieces of plated material in areas 30, 32 and 34 are not connected to any other portion of plated material and thus become unconnected pieces of plated material which in effect fall out of the recesses formed in the plating material forming the stencil plate.

The presence of the open areas 30, 32 and 34 overcome the overplating problem of the prior art and permit one to plate narrow strips of open area to the same height generally as large areas of plated material.

What is claimed is:

1. The method of forming a flat stencil plate, the steps comprising:
   (a) placing a resist coating on the surface of a matrix,
   (b) placing a film artwork over all the surface of the resist coating opposite from the side of the resist coating positioned against the matrix,
   (c) exposing the film artwork and resist coating to sensitize the resist coating in selected regions beneath the film artwork,
   (d) developing the resist coating to provide a pattern of resist material with large open areas of no resist material on the matrix and small islands of resist material on the matrix, at least some of the islands of resist material having narrow strips of open area extending completely through each island of resist material subdividing each island into a plurality of segments,
   (e) then plating the surface of the matrix to deposit material in the large open areas, and the narrow strips of open areas to form on the matrix the deposited material in the form of large areas of deposited material with apertures therein with narrow strips of deposited material extending across said aperatures,
   (f) removing resist material and the matrix from the plated material to permit the deposited material to form a flat stencil plate with apertures therein and some apertures having narrow strips of plating material extending from one side to the opposite side of the apertures, and
   (g) the improvement comprising;
      (1) providing an open area in each segment of resist formed in the step of sub-paragraph (d) with said open area unconnected to any other open area,
      (2) when plating the surface of the matrix, depositing material in the open areas of said segments to lessen or diminish the normal excessive deposition of material in the narrow strips of open area, and
      (3) when removing the resist material and matrix from the plated material, removing the pieces of plated material in the open areas of said segments since said pieces of plated material are unconnected to the rest of the plated material.

* * * * *